US012677608B2

(12) United States Patent
Nishizawa et al.

(10) Patent No.: US 12,677,608 B2
(45) Date of Patent: Jul. 7, 2026

(54) SEMICONDUCTOR DEVICE AND METHOD FOR MANUFACTURING THE SAME

(71) Applicant: Mitsubishi Electric Corporation, Tokyo (JP)

(72) Inventors: Koichiro Nishizawa, Tokyo (JP); Daisuke Tsunami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 459 days.

(21) Appl. No.: 18/040,927

(22) PCT Filed: Jan. 27, 2021

(86) PCT No.: PCT/JP2021/002914
§ 371 (c)(1),
(2) Date: Feb. 7, 2023

(87) PCT Pub. No.: WO2022/162804
PCT Pub. Date: Aug. 4, 2022

(65) Prior Publication Data
US 2023/0326758 A1 Oct. 12, 2023

(51) Int. Cl.
*H10P 14/46* (2026.01)
*H10D 30/01* (2025.01)
(Continued)

(52) U.S. Cl.
CPC ......... *H10P 14/46* (2026.01); *H10D 30/0616* (2025.01); *H10D 30/6738* (2025.01);
(Continued)

(58) Field of Classification Search
CPC .............. H01L 21/288; H01L 21/0206; H01L 21/02071; H01L 21/30612;
(Continued)

(56) References Cited

U.S. PATENT DOCUMENTS 7,619,248 B1 * 11/2009 Cleeves ................. H10D 62/40
257/E29.289
7,655,566 B2 * 2/2010 Fujii .................... H01L 21/0272
257/E21.44
(Continued)

FOREIGN PATENT DOCUMENTS

CN 101834240 A * 9/2010 ....... H01L 21/02381
JP 2007043113 A * 2/2007 ............. C23C 18/14
(Continued)

OTHER PUBLICATIONS

Horikiri et al., "Simple Photoelectrochemical Etching for Recess Gate GaN HEMT", IEICE Technical Report ED2019-98, MW2019-132(Jan. 2020), Jan. 2020.
(Continued)

*Primary Examiner* — Mohammed Shamsuzzaman
(74) *Attorney, Agent, or Firm* — Studebaker Brackett PLLC

(57) ABSTRACT
A substrate (1) having a GaN surface (2) is immersed in a catalyst metal solution (4) containing, potassium hydroxide and a plating catalyst metal salt while being irradiated with ultraviolet light to deposit a catalyst metal (5) on the GaN surface (2). A metal film (7) is formed on the GaN surface (2) having the catalyst metal (5) deposited thereon by electroless plating.

7 Claims, 9 Drawing Sheets

(51) Int. Cl.

| | |
|---|---|
| *H10D 30/67* | (2025.01) |
| *H10D 62/85* | (2025.01) |
| *H10D 64/01* | (2025.01) |
| *H10D 64/27* | (2025.01) |
| *H10D 64/64* | (2025.01) |
| *H10P 50/64* | (2026.01) |
| *H10P 70/00* | (2026.01) |

(52) U.S. Cl.
   CPC .......... *H10D 30/675* (2025.01); *H10D 62/85* (2025.01); *H10D 64/01* (2025.01); *H10D 64/411* (2025.01); *H10D 64/64* (2025.01); *H10P 50/646* (2026.01); *H10P 70/23* (2026.01); *H10P 70/273* (2026.01)

(58) Field of Classification Search
   CPC .......... H01L 21/30635; H10D 30/0616; H10D 30/6738; H10D 30/675; H10D 62/85; H10D 64/01; H10D 64/411; H10D 64/64; H10D 30/015; H10D 30/87
   See application file for complete search history.

(56) References Cited

U.S. PATENT DOCUMENTS

| | | | | | |
|---|---|---|---|---|---|
| 9,276,382 | B2 * | 3/2016 | Fischer | ............. | H01L 21/30635 |
| 10,458,038 | B2 * | 10/2019 | Zhang | ................. | H01L 21/0237 |
| 2006/0154391 | A1 * | 7/2006 | Tran | ....................... | H10H 20/82 |
| | | | | | 438/22 |

| | | | | | |
|---|---|---|---|---|---|
| 2007/0004202 | A1 * | 1/2007 | Fujii | .................. | H10D 30/6737 |
| | | | | | 257/E29.147 |
| 2007/0148967 | A1 * | 6/2007 | Kim | ....................... | C25D 5/022 |
| | | | | | 257/E21.585 |
| 2007/0166851 | A1 * | 7/2007 | Tran | ....................... | H10H 20/82 |
| | | | | | 438/22 |
| 2009/0283800 | A1 * | 11/2009 | Im | ..................... | H01L 21/30617 |
| | | | | | 438/746 |

FOREIGN PATENT DOCUMENTS

| | | | | | |
|---|---|---|---|---|---|
| JP | 2007059893 A | * | 3/2007 | ......... | H01L 21/0271 |
| JP | 2010092957 A | * | 4/2010 | ............. | H05K 3/067 |
| JP | 2010186873 A | * | 8/2010 | ............. | G11B 5/746 |
| JP | 2010247109 A | * | 11/2010 | ......... | H01L 21/3205 |
| JP | 2014170601 A | * | 9/2014 | ............. | G11B 5/746 |
| JP | 2015147190 A | * | 8/2015 | ....... | H01L 21/02381 |
| JP | 2017017111 A | * | 1/2017 | ......... | H01L 21/3205 |
| WO | WO-2010041370 A1 | * | 4/2010 | ............. | H10H 20/82 |
| WO | WO-2011048128 A2 | * | 4/2011 | ............. | B01J 21/063 |
| WO | WO-2011162372 A1 | * | 12/2011 | ............... | C25B 1/04 |
| WO | WO-2016015134 A1 | * | 2/2016 | ....... | H01L 21/02381 |
| WO | WO-2020003878 A1 | * | 1/2020 | ............. | H05K 3/067 |
| WO | WO-2024195269 A1 | * | 9/2024 | ......... | H01L 21/0271 |

OTHER PUBLICATIONS

International Search Report issued in PCT/JP2021/002914; mailed Mar. 23, 2021.

* cited by examiner

SEMICONDUCTOR DEVICE AND METHOD FOR MANUFACTURING THE SAME

FIELD

The present disclosure relates to a semiconductor device and a method for manufacturing the same wherein a metal film is formed on a GaN surface of a substrate.

BACKGROUND

A GaN substrate or a semiconductor substrate with an epitaxially grown GaN layer is used in an integrated circuit (IC) including a semiconductor transistor structure. GaN is widely used for high-frequency devices or laser light-emitting devices because it has high electron mobility and wide-bandgap characteristics. Note that a method of etching GaN through a photoelectrochemical reaction is disclosed (see, for example, NPL 1).

CITATION LIST

Non Patent Literature

[NPL 1] Fumimasa HORIKIRI, "Simple Photoelectrochemical Etching for Recess Gate GaN HEMT", IEICE Technical Report ED2019-98, MW2019-132 (2020-01)

SUMMARY

Technical Problem

A method for manufacturing a monolithic microwave integrated circuit (MMIC), a high-frequency device, includes a step of configuring an electric circuit by patterning a metal film on a semiconductor substrate. However, there has been a problem in that GaN has low reactivity with metals, resulting in poor adhesion to the metal film. In addition, the MMIC has a structure of an electrode and wiring that connect the front and back surfaces of the semiconductor substrate, called a via structure. When the metal film is formed by sputtering or vapor deposition, the thickness of the film formed on the via sidewalls becomes extremely thin compared to the thickness of the film formed on other surfaces. Therefore, it has been difficult to obtain the film thickness necessary for electrical conduction. Although plating allows films to be formed relatively well even on such a structure, there has been no technique for directly plating the GaN surface.

The present disclosure has been made to solve the problems as mentioned above, and an object thereof is to provide a semiconductor device capable of forming a metal film with good adhesion on the GaN surface of a substrate and a method for manufacturing the same.

Solution to Problem

A method for manufacturing a semiconductor device according to the present disclosure includes: immersing a substrate having a GaN surface in a catalyst metal solution containing potassium hydroxide and a plating catalyst metal salt while being irradiated with ultraviolet light to deposit a catalyst metal on the GaN surface; and forming a metal film on the GaN surface having the catalyst metal deposited thereon by electroless plating.

Advantageous Effects of Invention

In the present disclosure, the substrate having the GaN surface is immersed in the catalyst metal solution containing potassium hydroxide and a plating catalyst metal salt while being irradiated with ultraviolet light to deposit the catalyst metal on the GaN surface. By performing electroless plating on the thus obtained GaN surface having the catalyst metal deposited thereon, the metal film can be formed. Since the catalyst metal is deposited by replacing Ga in a GaN crystal, the bond between the catalyst metal and the substrate is strong and thus high adhesion can be obtained. Hence, it is possible to form a metal film with good adhesion on the GaN surface of the substrate.

DESCRIPTION OF EMBODIMENTS

A semiconductor device and a method for manufacturing the same according to the embodiments of the present disclosure will be described with reference to the drawings. The same components will be denoted by the same symbols, and the repeated description thereof may be omitted.

Embodiment 1

Figure 1:
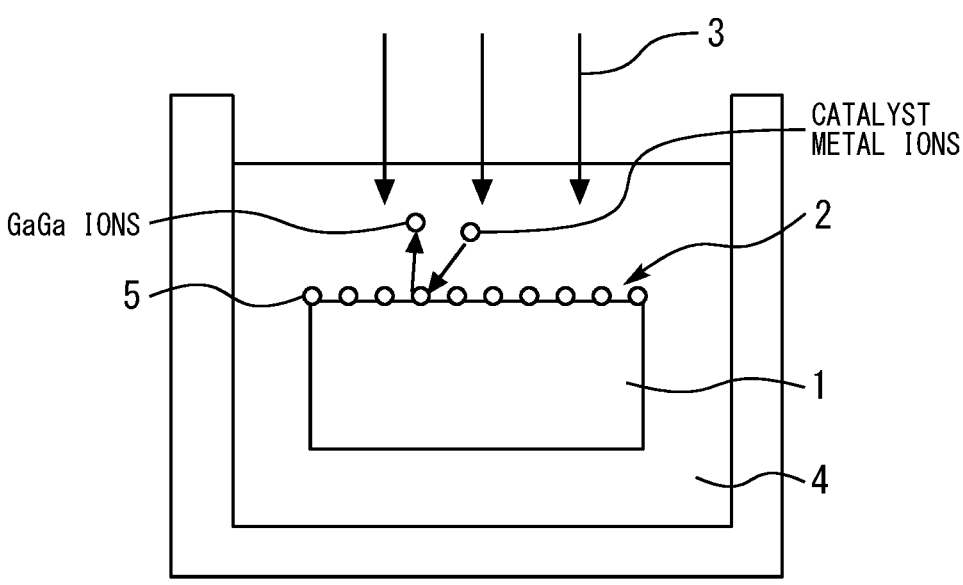
FIG. 1 is a cross-sectional view illustrating a method for manufacturing a semiconductor device according to Embodiment 1.
Figure 2:
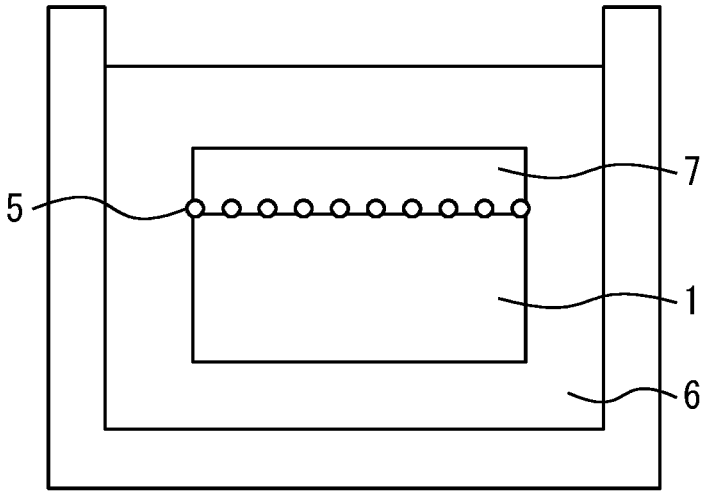
FIG. 2 is a cross-sectional view illustrating a method for manufacturing a semiconductor device according to Embodiment 1.

FIG. 1 and FIG. 2 are cross-sectional views illustrating a method for manufacturing a semiconductor device according to Embodiment 1. A substrate 1 is a GaN substrate or a SiC substrate on which a GaN layer is epitaxially grown and has a GaN surface 2, an exposed surface of GaN.

First, as illustrated in FIG. 1, the substrate 1 is immersed in a catalyst metal solution 4 containing potassium hydroxide and a plating catalyst metal salt while being irradiated with ultraviolet light 3 having energy equal to or greater than the bandgap of GaN.

The GaN surface 2 is etched by photoelectrochemical (PEC) reaction when being irradiated with the ultraviolet light 3. When the substrate 1 is immersed in a solution containing potassium hydroxide and irradiated with the ultraviolet light 3 having energy equal to or greater than the bandgap of GaN, Ga is ionized with the generation of electrons, as shown in the following formula. Ga ions react with hydroxide ions to form $Ga_2O_3$, which dissolves in the solution. In the formula, (s) is solid, (g) is gas, and (l) is liquid. With a metal salt that serves as a catalyst for electroless plating added to and dissolved in the potassium hydroxide solution, a catalyst metal 5 can be deposited on the GaN surface 2 using electrons generated by the reaction of dissolution of Ga.

$$GaN(s) + 3h^+ \Rightarrow Ga^{3+} + 1/2 \ N_2(g)\uparrow$$

$$Ga^{3+} + 3OH^- \Rightarrow 1/2 \ Ga_2O_3(s) + 3/2 \ H_2O(l)$$

A potassium hydroxide concentration of 0.005 to 0.05 mol/L is suitable for dissolving the substrate 1. The catalyst metal solution 4 may contain potassium hydroxide and a plating catalyst metal salt, and may also contain other components. This is common to all solutions described below.

The ultraviolet light 3 has energy equal to or greater than the bandgap of GaN. Since the bandgap of a GaN semiconductor is 3.4 eV, which is 365 nm in wavelength, the ultraviolet light 3 has a wavelength of 365 nm or less.

A metal with catalytic activity for electroless plating deposition such as palladium (Pd), gold (Au), silver (Ag), platinum (Pt), copper (Cu), nickel (Ni), tin (Sn), and ruthenium (Ru) is used as a catalyst metal.

A large amount of catalytic metal ions that act on the GaN surface 2 in the solution results in increased amount of catalytic metal oxides deposited without contributing to a reaction replacing Ga on the substrate 1. The presence of the oxides reduces the adhesion between an electroless plating film to be formed in the next step and the substrate 1. On the other hand, with a small amount of catalyst metal, the GaN surface 2 is not sufficiently coated with the catalyst metal, resulting in lower adhesion. Thus, if the catalyst metal concentration is too high or too low, the adhesion of the plating film is reduced. Therefore, the ion concentration of the catalyst metal in the catalyst metal solution 4 is preferably from 0.1 mmol/L to 2.0 mmol/L.

The temperature of the catalyst metal solution 4 is preferably from 10° C. to 50° C. If the temperature of the catalyst metal solution 4 is higher than 50° C., the adhesion decreases because of increased deposition due to oxidation or the like other than the substrate interface reaction with the substrate 1. If the temperature of the catalyst metal solution 4 is lower than 10° C., the reaction between the catalyst metal solution 4 and the substrate 1 does not proceed and thus deposition does not proceed.

The time of treatment with the catalyst metal solution 4 is preferably from 1 minute to 5 minutes. If the treatment time is shorter than 1 minute, the catalyst metal 5 is not sufficiently formed. If the treatment time is longer than 5 minutes, the deposition is not uniform. Note that the treatment with the catalyst metal solution 4 may be carried out dividedly into multiple times with water washing step in-between. Thus, it is possible to promote the formation of the catalyst metal 5.

Next, as illustrated in FIG. 2, the substrate 1 is immersed in an electroless plating solution 6 to form a metal film 7 on the GaN surface 2 of the substrate 1 by electroless plating. Note that uniform film thickness and morphology of the metal film 7 can be obtained by stirring or constant circulating filtration.

If the temperature of the electroless plating solution 6 is higher than 90° C., there is a problem in that components of the solution decompose. If the temperature of the electroless plating solution 6 is lower than 70° C., the reaction slows down significantly and thus the deposition is less likely to occur. Therefore, the temperature of the electroless plating solution 6 at which the plating reaction is most stable is 70° C. to 90° C.

The metal film 7 formed by electroless plating is of, for example, palladium (Pd), gold (Au), silver (Ag), platinum (Pt), copper (Cu), nickel (Ni), tin (Sn), ruthenium (Ru), an alloy including a combination of these metals, or an alloy of these metals with boron (B), phosphorus (P), and tungsten (W).

As described above, in the present embodiment, the substrate 1 having the GaN surface 2 is immersed in the catalyst metal solution 4 containing potassium hydroxide and a plating catalyst metal salt while being irradiated with ultraviolet light to deposit the catalyst metal 5 on the GaN surface 2. By performing electroless plating on the thus obtained GaN surface 2 having the catalyst metal 5 deposited thereon, the metal film 7 can be formed. Since the catalyst metal 5 is deposited by replacing Ga in a GaN crystal, the bond between the catalyst metal 5 and the substrate 1 is strong and thus high adhesion can be obtained. Hence, it is possible to form a metal film 7 with good adhesion on the GaN surface 2 of the substrate 1.

Figure 3:
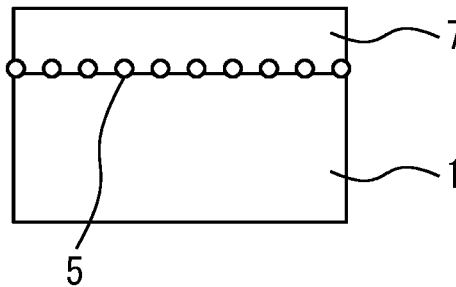
FIG. 3 is a cross-sectional view illustrating a semiconductor device according to Embodiment 1.
Figure 4:
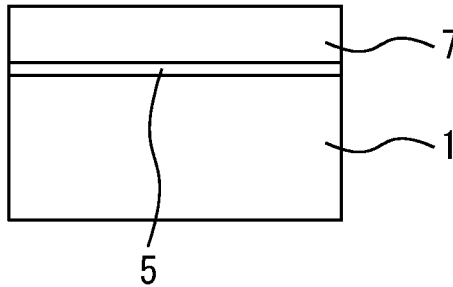
FIG. 4 is a cross-sectional view illustrating Modified Example 1 of a semiconductor device according to Embodiment 1.

FIG. 3 is a cross-sectional view illustrating a semiconductor device according to Embodiment 1. The metal film 7 is formed on the GaN surface 2 of the substrate 1. The catalyst metal 5 is formed in an island shape at the interface between the GaN surface 2 and the metal film 7. FIG. 4 is a cross-sectional view illustrating Modified Example 1 of a semiconductor device according to Embodiment 1. The catalyst metal 5 is formed as a thin film at the interface between the GaN surface 2 and the metal film 7. The catalyst metal 5 reacts on the substrate surface in a dispersed or uniform manner depending on the composition of the chemical solution and other factors, causing the catalyst metal 5, which is in the formation state of a thin film, to be in the form of an island or a uniform thin film, respectively.

It is preferred that the catalyst metal 5 be a platinum layer and that the metal film 7 contain at least one of nickel and cobalt, and boron or phosphorus. Examples of the metal film 7 include Ni—P, Ni—W—P, Co—P, and Co—W—P. Thus, the metal film 7 containing at least one of nickel and cobalt can be formed on the GaN surface 2 via platinum. Platinum has higher adhesion to GaN than alloys of nickel or cobalt, and can provide good adhesion as an electrode.

In addition, nickel, cobalt, and platinum are less likely to diffuse into the semiconductor, and can provide a semiconductor-metal interface having good Schottky connectivity with the GaN surface 2. The Schottky connectivity is a characteristic that allows a current to flow only in one direction between a semiconductor and a metal and one of the most important items of transistor characteristics. Therefore, the metal film 7 is used as a gate electrode when a transistor is formed on the substrate 1.

The metal film 7 also contains boron or phosphorus. Boron and phosphorus arbitrarily enter between metal crystals of nickel and cobalt, thus inhibiting crystallization. In particular, in the case of the metal film 7 being formed by electroless plating, an amorphous bonding state is formed. Since a crystal grain boundary is not formed in this bonding state, film characteristics become uniform and Schottky characteristics are stabilized.

Figure 5:
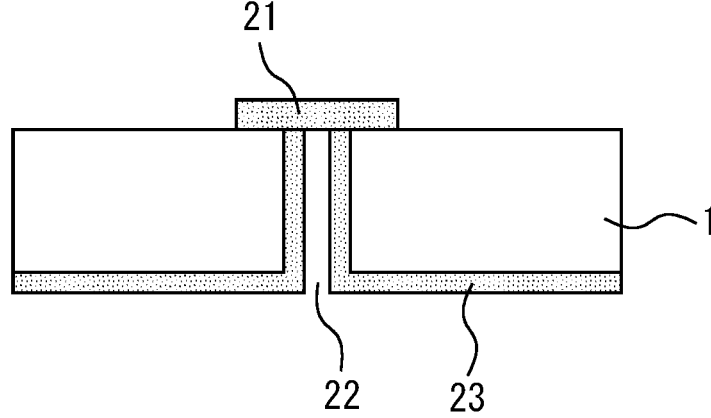
FIG. 5 is a cross-sectional view illustrating Modified Example 2 of a semiconductor device according to Embodiment 1.

FIG. 5 is a cross-sectional view illustrating Modified Example 2 of a semiconductor device according to Embodiment 1. A surface electrode 21, such as a MMIC, is formed on the surface of the substrate 1. A via 22 is formed through the substrate 1 from the back surface of the substrate 1 to the surface electrode 21. A back surface electrode 23 is formed on the back surface of the substrate 1 and the sidewalls of the via 22.

Figure 6:
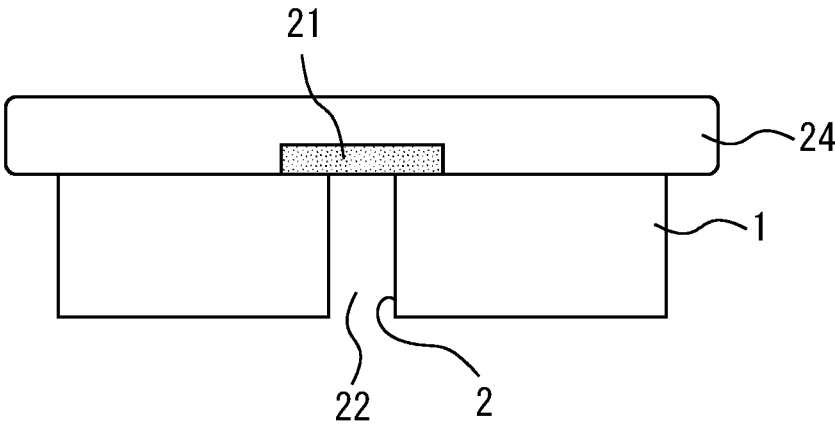
FIG. 6 is a cross-sectional view illustrating a method for manufacturing Modified Example 2 of a semiconductor device according to Embodiment 1.
Figure 7:
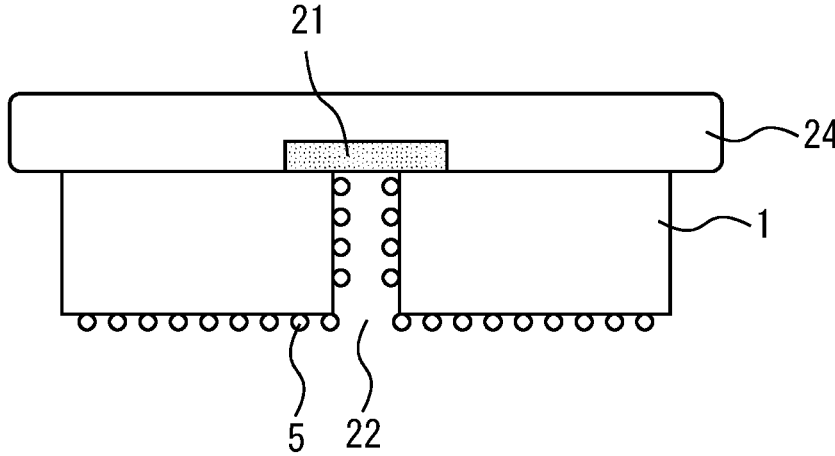
FIG. 7 is a cross-sectional view illustrating a method for manufacturing Modified Example 2 of a semiconductor device according to Embodiment 1.
Figure 8:
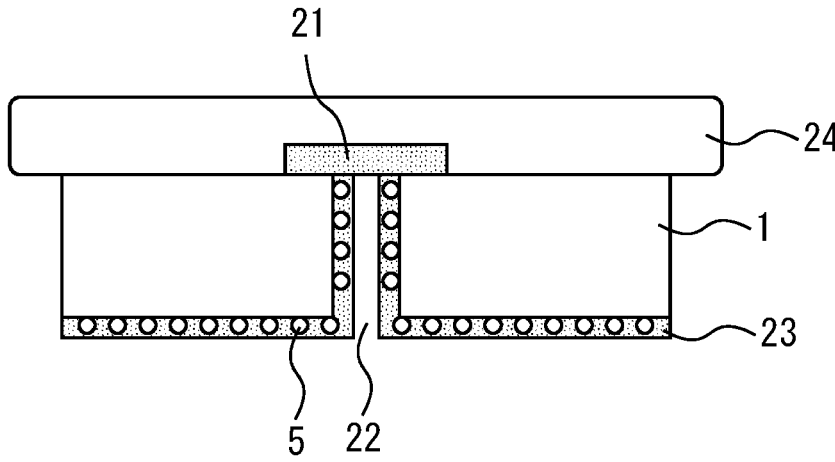
FIG. 8 is a cross-sectional view illustrating a method for manufacturing Modified Example 2 of a semiconductor device according to Embodiment 1.

FIG. 6 to FIG. 8 are cross-sectional views illustrating a method for manufacturing Modified Example 2 of a semiconductor device according to Embodiment 1. As illustrated in FIG. 6, the front and back surfaces of the substrate 1 with the via 22 formed, and the sidewalls of the via 22 are each the GaN surface 2. Of these, the front surface of substrate 1 is covered with a mask 24.

Next, the substrate 1 is immersed in the catalyst metal solution 4 containing potassium hydroxide and a plating catalyst metal salt while being irradiated with the ultraviolet light 3 having energy equal to or greater than the bandgap of GaN. Here, a GaN substrate or a SiC substrate on which a GaN layer can be epitaxially grown transmits ultraviolet light. Therefore, it is possible to irradiate the GaN surface on the sidewalls of the via 22 in the substrate 1 with ultraviolet light. As a result, the catalyst metal 5 is deposited on the GaN surface 2 of the back surface of the substrate 1 and the sidewalls of the via 22, as illustrated in FIG. 7. Next, as illustrated in FIG. 8, the back surface electrode 23 is formed by electroless plating on the GaN surface 2 having the catalyst metal 5 deposited. Since the GaN surface 2 can be directly plated by the manufacturing method of the present embodiment, the sidewalls of the via 22 can also be satisfactorily formed.

Embodiment 2

Figure 9:
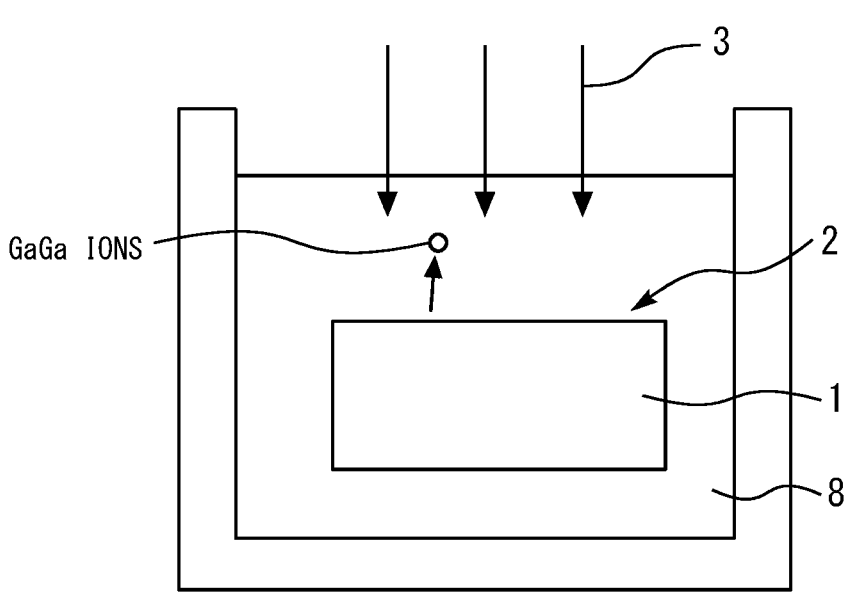
FIG. 9 is a cross-sectional view illustrating a method for manufacturing a semiconductor device according to Embodiment 2.
Figure 10:
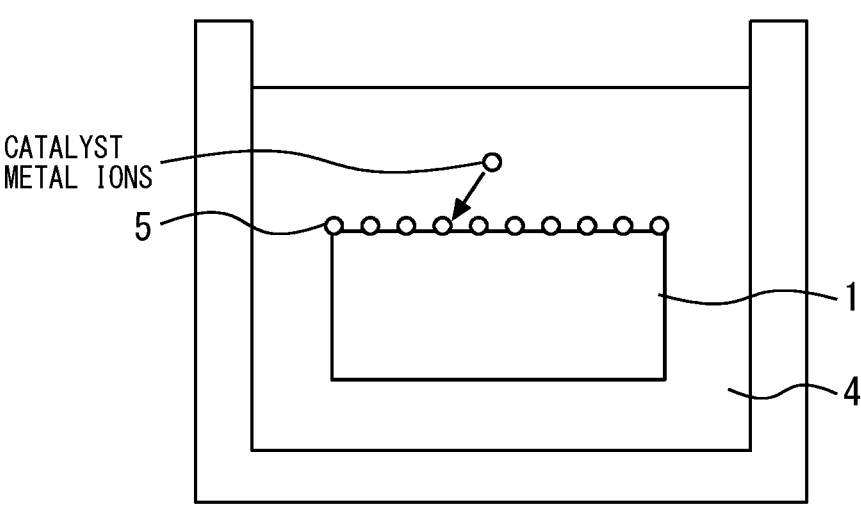
FIG. 10 is a cross-sectional view illustrating a method for manufacturing a semiconductor device according to Embodiment 2.

FIG. 9 and FIG. 10 are cross-sectional views illustrating a method for manufacturing a semiconductor device according to Embodiment 2. First, as illustrated in FIG. 9, the substrate 1 having the GaN surface 2 is immersed in the potassium hydroxide solution 8 to which potassium peroxodisulfate ($K_2S_2O_8$) is added, while being irradiated with the ultraviolet light 3. Thus, as shown in the following formula, Ga dissolves with the generation of holes due to the same effect as in Embodiment 1. The strong oxidizing power of potassium peroxodisulfate consumes excess electrons and thus the etching reaction continues.

$$GaN + phtocarriers\ (3h^+ + 3e^-) + 3SO_4{}^{\circ-} \Longrightarrow Ga^{3+} + 3SO_4{}^{2-} + 1/2\ N_2(g)\uparrow$$

The outermost surface layer of the GaN surface 2 has organic contamination or deteriorated crystallinity due to dangling bonds at the crystal interface. The GaN surface 2 with good crystallinity and no contamination can be obtained by removing the outermost surface layer through etching. The concentration of potassium peroxodisulfate in the potassium hydroxide solution 8 is preferably 0.01 to 0.1 mol/L. Thus, the GaN surface 2 is etched to a depth of 1 nm to 5 nm.

Next, as illustrated in FIG. 10, the substrate 1 is immersed in the catalyst metal solution 4. The etched, clean GaN surface 2 is highly active, causing a deposition reaction of the catalyst metal. Thus, the catalyst metal 5 is deposited on the GaN surface 2. The type and ion concentration of the catalyst metal, the temperature and treatment time of the catalyst metal solution 4, and other conditions are the same as in Embodiment 1.

Next, as in FIG. 2 of Embodiment 1, the substrate 1 having the catalyst metal 5 deposited thereon is immersed in the electroless plating solution 6 to form the metal film 7 on the GaN surface 2 of the substrate 1 by electroless plating. Thus, it is possible to form the metal film 7 with good adhesion on the GaN surface 2 of the substrate 1, as in Embodiment 1.

Embodiment 3

FIG. 11 to FIG. 16 are cross-sectional views illustrating a method for manufacturing a semiconductor device according to Embodiment 3. The substrate 1 is an i-GaN substrate 1a on which an n-GaN layer 1b is epitaxially grown. The surface of the exposed n-GaN layer 1b is the GaN surface 2.

Figure 11:
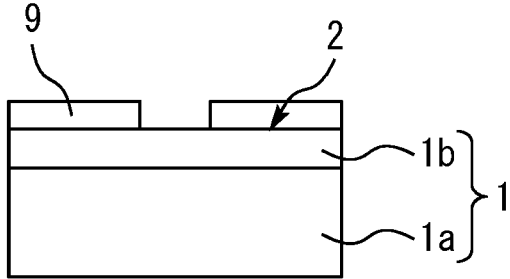
FIG. 11 is a cross-sectional view illustrating a method for manufacturing a semiconductor device according to Embodiment 3.

First, as illustrated in FIG. 11, a mask pattern 9 is formed on the GaN surface 2. For example, a mask is formed on the entire GaN surface 2 by chemical vapor deposition (CVD) or sputtering, and then the mask in the electrode forming portion is removed by, for example, dry processing using a resist pattern to form a mask pattern 9.

The mask pattern 9 is, for example, a silicon nitride film (Si—N), a silicon oxide film (Si—O), or a material with high chemical resistance such as Ti, W, or other metals. If the mask pattern 9 is thin, the uniformity of film thickness is poor, while if the mask pattern 9 is too thick, the stress on the film causes delamination or cracking. Thus, the mask pattern 9 preferably has a thickness of approximately 50 nm to 500 nm.

Figure 12:
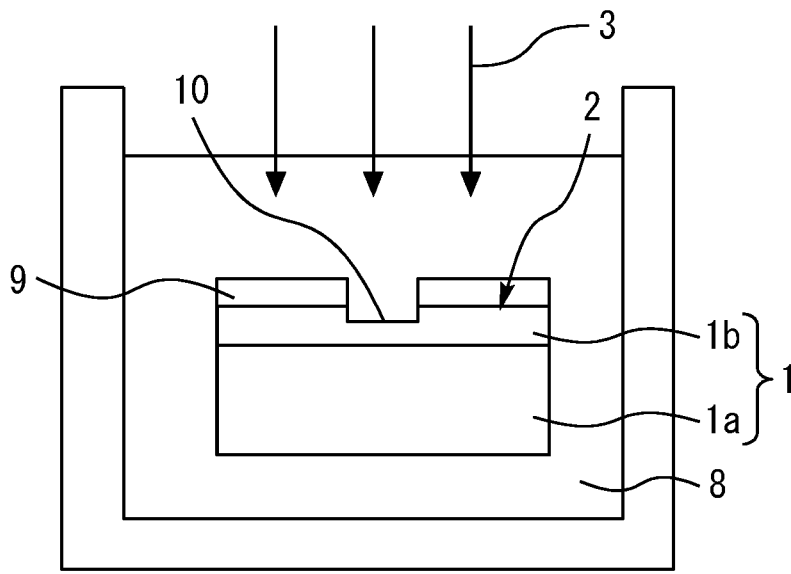
FIG. 12 is a cross-sectional view illustrating a method for manufacturing a semiconductor device according to Embodiment 3.

Next, as illustrated in FIG. 12, the substrate 1 having the GaN surface 2 is immersed in a potassium hydroxide solution 8 to which potassium peroxodisulfate is added, while being irradiated with ultraviolet light to etch the GaN surface 2. Thus, a recess 10 is formed in the GaN surface 2.

The concentration of potassium peroxodisulfate is preferably 0.01 to 0.1 mol/L. Thus, the GaN surface 2 is etched only to a depth of 1 nm to 500 nm. The amount of etching affects electrical device characteristics. If the amount of etching is small, the characteristics deteriorate due to the influence of the outermost surface layer. If the amount of etching is too large, the characteristics also deteriorate due to fewer epitaxially grown active layers.

Figure 13:
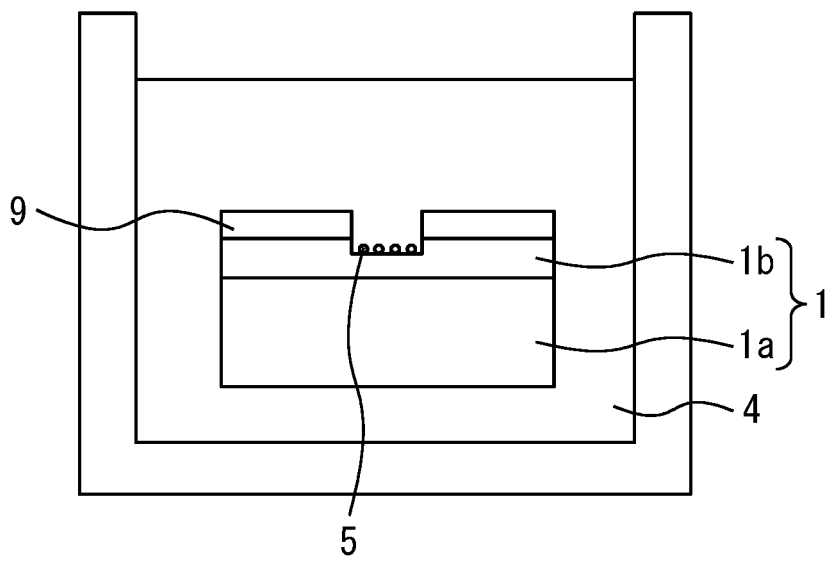
FIG. 13 is a cross-sectional view illustrating a method for manufacturing a semiconductor device according to Embodiment 3.
Figure 14:
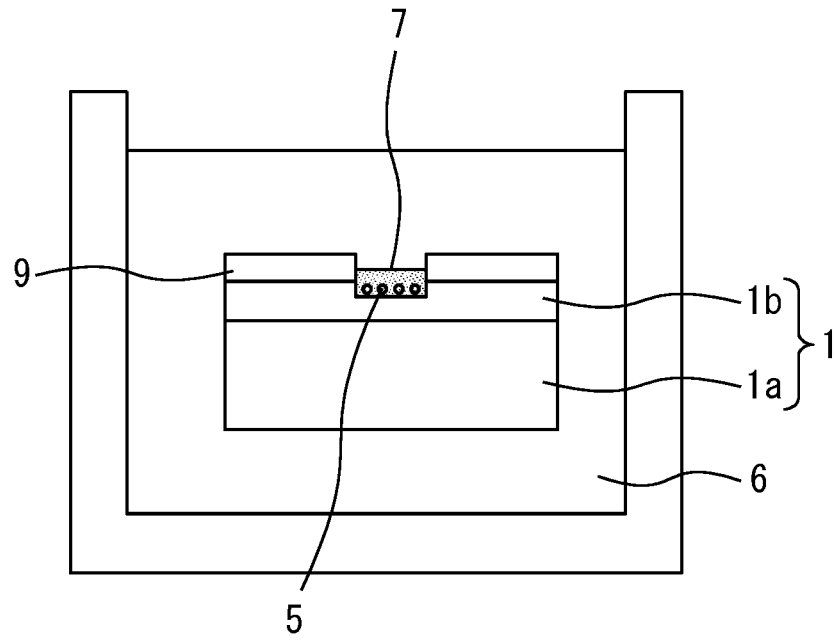
FIG. 14 is a cross-sectional view illustrating a method for manufacturing a semiconductor device according to Embodiment 3.

Next, as illustrated in FIG. 13, the substrate 1 is immersed in the catalyst metal solution 4 to deposit the catalyst metal 5 on the GaN surface 2 in the recess 10. Then, as illustrated in FIG. 14, the substrate 1 having the catalyst metal 5 deposited thereon is immersed in the electroless plating solution 6. Thus, a metal film 7 is formed on the GaN surface 2 in the recess 10 by electroless plating.

Figure 15:
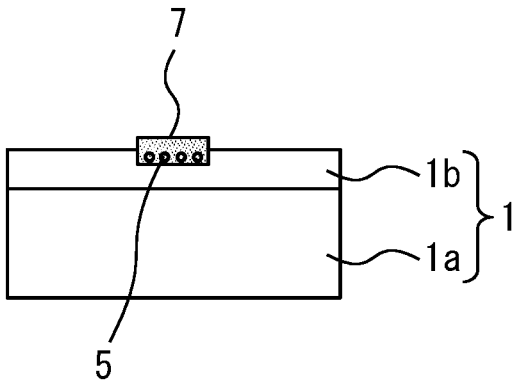
FIG. 15 is a cross-sectional view illustrating a method for manufacturing a semiconductor device according to Embodiment 3.
Figure 16:
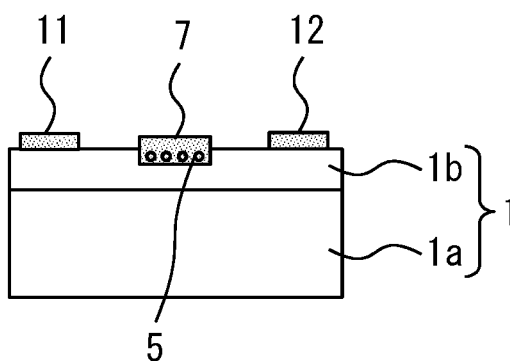
FIG. 16 is a cross-sectional view illustrating a method for manufacturing a semiconductor device according to Embodiment 3.

Next, as illustrated in FIG. 15, the mask pattern 9 is removed. For example, in the case of the mask pattern 9 being made of silicon nitride, the mask pattern 9 is dissolved and removed by being immersed in a hydrofluoric acid solution. The remaining metal film 7 becomes a patterned gate electrode. Thereafter, as illustrated in FIG. 16, a source electrode 11 and a drain electrode 12 are each formed on the GaN surface 2.

As described above, the gate electrode is formed by plating on the GaN surface 2 in which only the gate electrode forming portion is etched. Thus, it is possible to form a gate electrode with good adhesion on the GaN surface 2 of the substrate 1. In addition, it is possible to obtain a semiconductor-metal interface with good Schottky connection.

Figure 17:
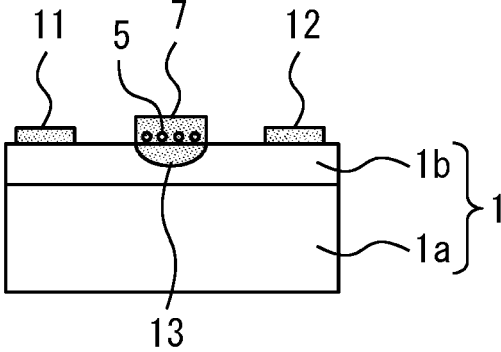
FIG. 17 is a cross-sectional view illustrating an operation of the semiconductor device according to the comparative example.
Figure 18:
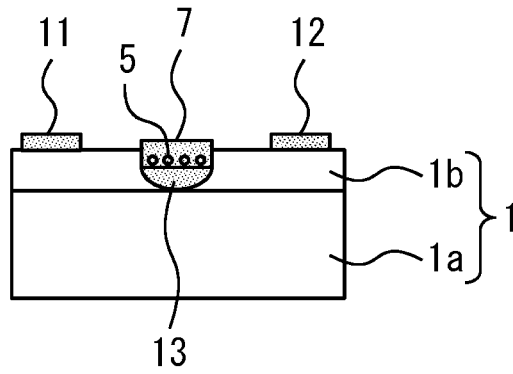
FIG. 18 is a cross-sectional view illustrating an operation of the semiconductor device according to Embodiment 3.

Subsequently, an operation of the semiconductor device according to the present embodiment will be described in comparison with a comparative example. FIG. 17 is a cross-sectional view illustrating an operation of the semi-conductor device according to the comparative example. FIG. 18 is a cross-sectional view illustrating an operation of the semiconductor device according to Embodiment 3.

The current flowing from the drain electrode 12 to the source electrode 11 can pass through an n-GaN layer 1b into which carriers are injected, but not through an i-GaN sub-strate 1a. When a gate voltage is applied, a depletion layer 13 in which free electrons do not exist is formed under the gate electrode. The thickness of the depletion layer 13 changes by varying the gate voltage. Thus, the amount of current can be controlled.

Since there is no recess 10 in the comparative example, the depletion layer 13 is not thick enough, resulting in current leakage. In the present embodiment, the current can be easily controlled by providing the recess 10 under the gate electrode. The depth of the recess 10 determines the maximum amount of the current.

REFERENCE SIGNS LIST

1 substrate; 2 GaN surface; 4 catalyst metal solution; 5 catalyst metal; 7 metal film; 8 potassium hydroxide solution; 9 mask pattern; 10 recess

The invention claimed is:

1. A method for manufacturing a semiconductor device comprising:

a photoelectrochemical etching step comprising:

immersing a substrate having a GaN surface in a catalyst metal solution containing potassium hydroxide and a plating catalyst metal salt while the GaN surface is irradiated with ultraviolet light such that Ga from the GaN surface dissolves in the catalyst metal solution and creates electrons and the plating catalyst metal of the plating catalyst metal salt is deposited on the GaN surface using the electrons; and an electroless plating step comprising:

forming a metal film on the GaN surface having the plating catalyst metal deposited thereon by immersing the substrate in an electroless plating solution.

2. The method for manufacturing a semiconductor according to claim 1, wherein the ultraviolet light has a wavelength of 365 nm or less.

3. The method for manufacturing a semiconductor according to claim 1, wherein an ion concentration of a catalyst metal in the catalyst metal solution is from 0.1 mmol/L to 2.0 mmol/L.

4. The method for manufacturing a semiconductor according to claim 1, wherein temperature of the catalyst metal solution is from 10° C. to 50° C.

5. The method for manufacturing a semiconductor according to claim 1, wherein time of treatment with the catalyst metal solution is from 1 minute to 5 minutes.

6. The method for manufacturing a semiconductor according to claim 1, wherein a treatment with the catalyst metal solution is carried out dividedly into multiple times with water washing step in-between.

7. The method for manufacturing a semiconductor according to claim 1, wherein temperature of the electroless plating solution is 70° C. to 90° C.

* * * * *